(12) United States Patent
Kume et al.

(10) Patent No.: US 8,828,479 B2
(45) Date of Patent: Sep. 9, 2014

(54) PROCESS FOR PRODUCING LIGHT ABSORBING LAYER FOR CHALCOPYRITE TYPE THIN-FILM SOLAR CELL

(75) Inventors: Tomoyuki Kume, Tochigi (JP); Takashi Komaru, Tochigi (JP)

(73) Assignee: Honda Motor Co., Ltd., Tokyo (JP)

(*) Notice: Subject to any disclaimer, the term of this patent is extended or adjusted under 35 U.S.C. 154(b) by 2139 days.

(21) Appl. No.: 10/599,689

(22) PCT Filed: Apr. 8, 2005

(86) PCT No.: PCT/JP2005/006944
§ 371 (c)(1),
(2), (4) Date: Oct. 5, 2006

(87) PCT Pub. No.: WO2005/098968
PCT Pub. Date: Oct. 20, 2005

(65) Prior Publication Data
US 2008/0035199 A1 Feb. 14, 2008

(30) Foreign Application Priority Data
Apr. 9, 2004 (JP) ................................. 2004-115489

(51) Int. Cl.
*H01L 31/00* (2006.01)
*H01L 31/032* (2006.01)

(52) U.S. Cl.
CPC ......... *H01L 31/0322* (2013.01); *Y02E 10/541* (2013.01)
USPC ......................................... 427/74

(58) Field of Classification Search
USPC ............................................. 427/76
See application file for complete search history.

(56) References Cited

U.S. PATENT DOCUMENTS

| | | | |
|---|---|---|---|
| 5,028,274 A * | 7/1991 | Basol et al. | 136/264 |
| 5,045,409 A * | 9/1991 | Eberspacher et al. | 428/620 |
| 5,436,204 A * | 7/1995 | Albin et al. | 438/488 |
| 5,445,973 A * | 8/1995 | Hedstrom | 438/95 |
| 5,728,231 A * | 3/1998 | Negami et al. | 148/33 |
| 5,981,868 A * | 11/1999 | Kushiya et al. | 136/262 |
| 7,374,963 B2 * | 5/2008 | Basol | 438/95 |

* cited by examiner

*Primary Examiner* — Robert Vetere
(74) *Attorney, Agent, or Firm* — Rankin, Hill & Clark LLP (57) ABSTRACT

A process for producing a light absorbing layer for thin-film solar cell that possesses a film structure having a constituent component of chalcopyrite compound $(Cu(In+Ga)Se_2)$ uniformly distributed thereinside. There is provided a process for producing a light absorbing layer, including the precursor forming step of superimposing on an Mo electrode layer, adjacent to the electrode layer, an In metal layer and a Cu—Ga alloy layer according to sputtering technique; a first selenization step of, while accommodating precursor-provided substrate in an airtight space, introducing hydrogen selenide gas in the airtight space conditioned so as to range from room temperature to 250° C.; a second selenization step of additionally introducing hydrogen selenide gas in the airtight space heated so as to range from 250° to 450° C.; a third selenization step of, while causing the hydrogen selenide gas having been introduced up to the second selenization step to remain, heating the interior of the airtight space so as to range from 450° to 650° C. and, within this range of temperature, performing heat treatment of the substrate; and a cooling step of cooling the substrate after the heat treatment.

2 Claims, 5 Drawing Sheets

PROCESS FOR PRODUCING LIGHT ABSORBING LAYER FOR CHALCOPYRITE TYPE THIN-FILM SOLAR CELL

TECHNICAL FIELD

The present invention relates to a process for producing a light absorbing layer for a chalcopyrite type thin-film solar cell in which the light absorbing layer includes a chalcopyrite compound layer.

BACKGROUND ART

Of various solar cells broadly classified into silicon solar cells, thin-film solar cells, and compound solar cells, thin-film solar cells have been commercialized as optical devices using thin-film technology because its manufacturing process is simple and achieves low energy. A chalcopyrite type thin-film solar cell belongs to thin-film type and comprises a CIGS layer made of a chalcopyrite compound ($Cu(In+Ga)Se_2$: CIGS) as a p-type light absorbing layer. It is known that the light absorbing layer made of such a compound enables a solar cell to have high photoelectric conversion efficiency particularly when the light absorbing layer is combined with a glass substrate containing an alkali metal such as soda lime glass. Research and development have been conducted for mass-producing such a thin-film solar cell because of its high radiation resistance as well as high reliability obtained by remarkably reducing photo deterioration (secular change) arising from a lattice defect and the intrusion of an impurity, photosensitivity obtained in a wide light absorbing wavelength region including a long wavelength band, and a high optical absorption coefficient.

Figure 1:
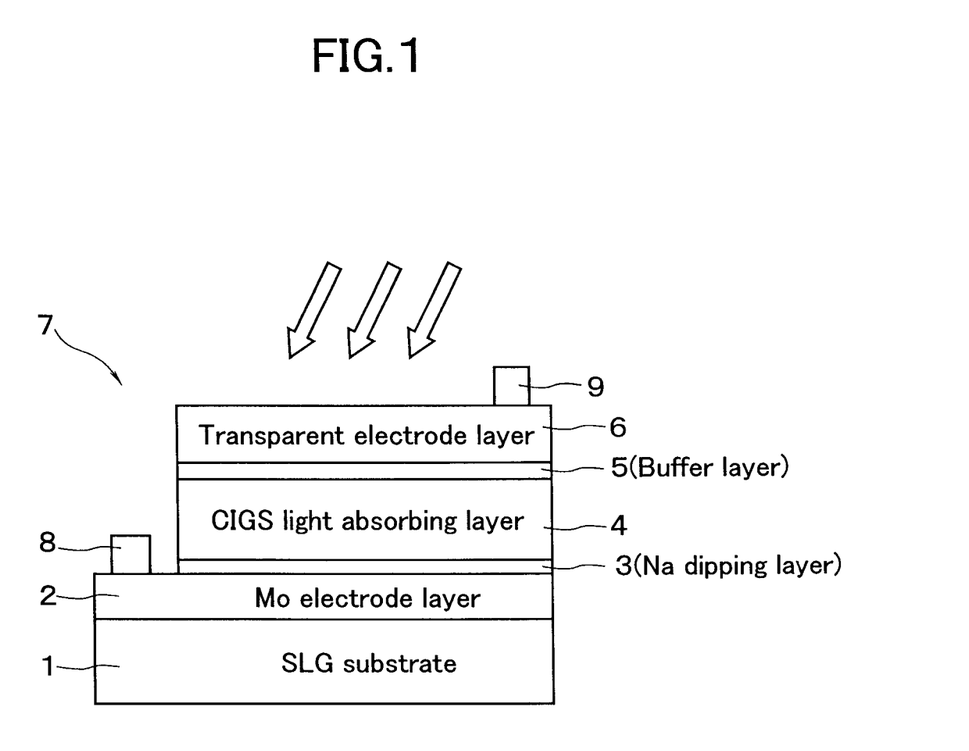
FIG. 1 is a schematic diagram showing the layer structure of a typical thin-film solar cell.

FIG. 1 shows the layer structure of a typical thin-film solar cell comprising a CIGS layer as a light absorbing layer. The solar cell has a multilayer structure 7 which comprises, on a soda lime glass (SLG) substrate 1, an underside electrode layer 2 acting as a positive electrode and including an Mo metal layer, a Na dipping layer 3 for preventing uneven Na distribution caused by the SLG substrate 1, the above-mentioned CIGS light absorbing layer 4, an n-type buffer layer 5, and an outermost transparent electrode layer 6 acting as a negative electrode.

When light such as sunlight is incident on an upper light-receiving part of the solar cell, excitation caused by the light having energy not lower than a band gap generates a pair of an electron and a positive hole around the p-n junction of the multilayer structure 7. The excited electron and positive hole are diffused to the p-n junction, and the internal electric field of the junction separates the electron and the positive hole to an n-region and a p-region, respectively. As a result, the n-region is negatively charged and the p-region is positively charged, causing a potential difference between electrodes 8 and 9 provided in the respective regions. The potential difference acts as electromotive force and provides photocurrent for the electrodes connected via a conductor. This is the principle of the solar cell.

FIG. 2 is a process drawing showing a process for producing the chalcopyrite type thin-film solar cell having the multilayer structure 7 shown in FIG. 1.

Figure 2A:
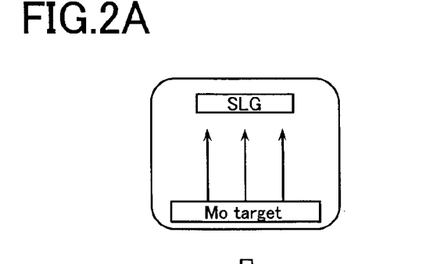
FIG. 2 is a process drawing showing the production of the thin-film solar cell shown in FIG. 1.

In the production of the solar cell, first, the Mo electrode layer is formed on a clean glass substrate made of SLG or the like according to sputtering technique using a metallic Mo target (Mo electrode layer forming step: FIG. 2(a)).

Figure 2B:
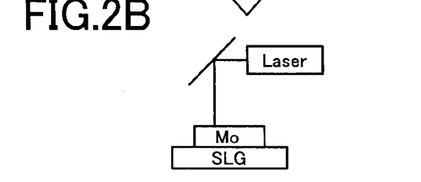

Then, the substrate where the Mo electrode layer is formed is divided to a desired size by laser cutting (first scribing step: FIG. 2(b)).

Figure 2C:
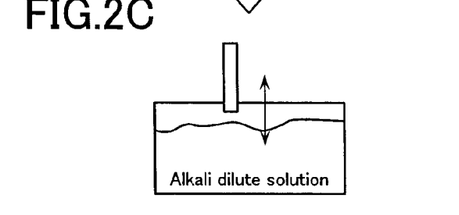
Figure 2D:
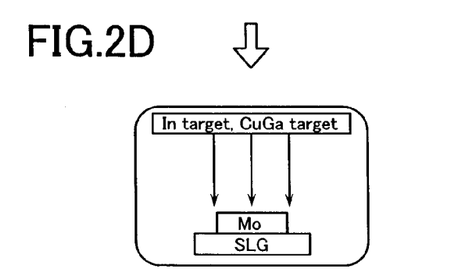

After the substrate is cleaned with water and so on to remove shavings or the like therefrom, the substrate is dipped into a diluted solution of a sodium containing compound such as sodium chloride (Na dipping layer deposition step: FIG. 2(c)). Thereafter, a two-layer structure of an In layer and a Cu—Ga layer is formed according to sputtering deposition using a metallic In target and a Cu—Ga alloy target (the step of forming the precursor of the light absorbing layer: FIG. 2(d)).

Figure 2E:
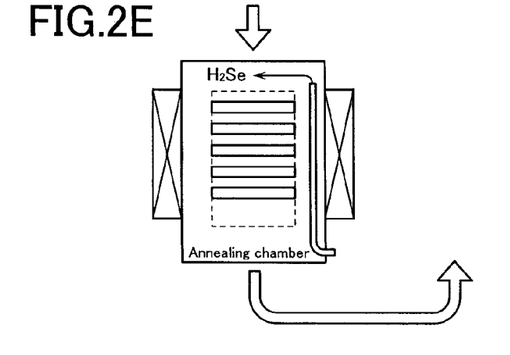

For example, in a conventional method of obtaining the CIGS light absorbing layer, as shown in FIG. 2(e), the substrate on which the precursor of the lower In layer and the upper Cu—Ga layer is superimposed is accommodated in an annealing chamber and preheated at 100° C. for ten minutes. After the preheating, hydrogen selenide ($H_2Se$) gas is introduced through a gas inlet tube inserted into the annealing chamber, and the interior of the chamber is heated so as to range from 500° C. to 520° C. while the gas is passed through the chamber. Such annealing transforms the precursor having a laminated structure of the In layer and the Cu—Ga layer into a signal CIGS layer. At this point, the Na dipping layer is diffused in the light absorbing layer and disappears therein. After the heat treatment, the hydrogen selenide gas acting as reactant gas is replaced with purge gas such as Ar gas, and then the purge gas is cooled (Japanese Laid-Open No. 2003-282908).

Figure 2F:
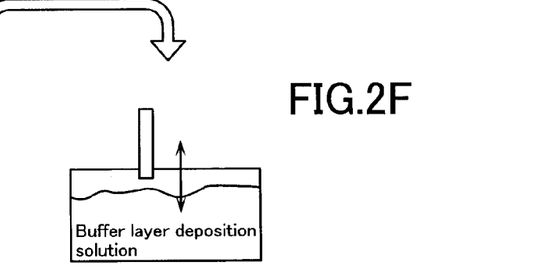

After the substrate with the CIGS layer is removed from the annealing chamber, the buffer layer is formed on the substrate using an n-type semiconductor material including CdS, ZnO, and InS according to chemical bath deposition or sputtering technique shown in FIG. 2(f).

Figure 2G:
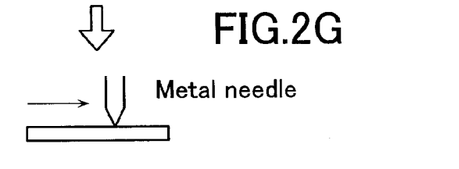

Further, on the substrate where the buffer layer is formed, cutting is performed using laser irradiation and a metal needle (second scribing step: FIG. 2(g)).

Figure 2H:
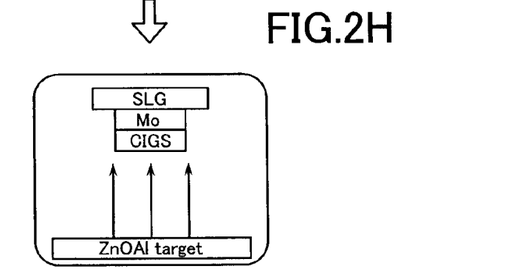

Thereafter, the outermost transparent conductive layer including a ZnOAl layer is formed according to sputtering technique using a ZnO—Al alloy target (FIG. 2(h)).

Figure 2I:
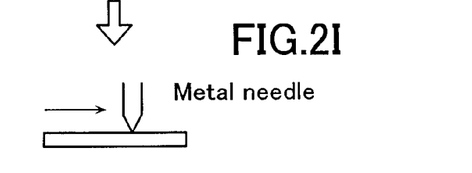

And then, on the substrate where the transparent conductive layer is formed, cutting is performed again using laser irradiation and a metal needle (third scribing step: FIG. 2(i)).

The above-mentioned thin-film solar cell having the laminated structure is obtained as a single cell made uniform in size by cutting. A final product has a flat laminated structure where these cells are connected in series.

Incidentally, in the case of the conventional thin-film solar cell including the CIGS light absorbing layer, in the step of transforming the precursor having the laminated structure of the In layer and the Cu—Ga layer into the single CIGS layer, film components of Cu, In, Ga and Se are locally present and unevenly distributed in the film structure of the formed CIGS light absorbing layer.

Particularly when the Cu—Ga layer and the In layer are superimposed in this order, alloying caused by solid layer diffusion tends to occur on an interface between the Cu—Ga layer and the In layer. Three components other than Se tend to be alloyed or the In layer tends to be deposited on the Cu—Ga layer, resulting in difficulty in transformation into the desired single CIGS layer. Moreover, when CIGS is crystallized by annealing, the film structure is reconstructed to increase a filling rate. The reconstruction involves an increase in film thickness. When the film increases in thickness, the constituent components are unevenly distributed along the thickness direction in the obtained single CIGS layer due to a difference in solid layer diffusion coefficient between the constituent components.

For example, it is needless to say that Ga components distributed with relatively high density on an electrode layer side are preferable in view of energy band and the unevenly distributed constituent components do not always cause a problem. However, it is known that adhesion is poor on the interface of the Mo electrode layer and metal Ga. When Ga components are unevenly distributed on the electrode layer side, the Ga components cause, in many cases, segregation on the interface of a high-density side. The segregation of the Ga components results in poor adhesion between the light absorbing layer and the electrode layer, so that the obtained thin-film solar cell has a structural problem of internal exfoliation. Patent Document 1: Japanese Patent Laid-Open No. 2003-282908

DISCLOSURE OF THE INVENTION

Problems to be Solved by the Invention

In the annealing disclosed in Japanese Patent Laid-Open No. 2003-282908, the Cu—Ga layer is superimposed on the In layer to prevent the Ga components from being unevenly distributed on a surface of the light absorbing layer. However, the film components are diffused by annealing and selenization is almost simultaneously performed by introducing hydrogen selenide gas, and thus an uneven state caused by a difference in diffusion coefficient between the constituent components affects the progress of selenization. For this reason, the uneven state remains particularly on the Ga and Se components.

In view of the problem, the present invention has as its object the provision of a process for producing a light absorbing layer for a chalcopyrite type thin-film solar cell that possesses a film structure having a constituent component of chalcopyrite compound uniformly distributed in a CIGS layer.

Means for Solving the Problems

In order to attain the object, the process for producing the light absorbing layer for the chalcopyrite type thin-film solar cell according to the present invention comprises: a precursor forming step of superimposing on a backside electrode layer formed on a substrate, an In metal layer adjacent to the electrode layer and a Cu—Ga alloy layer by sputtering; a first selenization step of accommodating the precursor-formed substrate in an airtight space and introducing hydrogen selenide gas into the airtight space conditioned to a temperature in the range from room temperature to 250° C.; a second selenization step of heating an interior of the airtight space to a temperature in the range in a range from 250° to 450° C. and additionally introducing hydrogen selenide gas into the airtight space; a third selenization step of heating the airtight space to a temperature in the range of 450° to 650° C. and performing heat treatment of the substrate under the above temperature conditions, while causing the hydrogen selenide gas introduced up to the second selenization step to remain in the space; and a cooling step of cooling the substrate after the heat treatment.

According to the present invention, after the first selenization step of preheating the substrate so as to range from room temperature to 250° C., Se components are extracted into the light absorbing layer and Ga components are diffused into the light absorbing layer in the second selenization step with a temperature range from 250° to 450° C. After the second selenization step, CIGS is crystallized and the film structure of the light absorbing layer is reconstructed in the third selenization step with a temperature range from 450° to 650° C. In the film structure of the light absorbing layer obtained after the third selenization step, the constituent components of chalcopyrite component including CIGS, particularly elements of Ga and Se are evenly distributed. The solar cell comprising the high-quality light absorbing layer is structurally stable and can positively achieve superiority in conversion efficiency, which is a characteristic of the chalcopyrite type thin-film solar cell.

According to the present invention, the second selenization step may include an evacuating step of interrupting the supply of hydrogen selenide gas and evacuating the interior of the airtight space.

This evacuating step temporarily brings the airtight space in a high vacuum and active hydrogen selenide gas is brought into contact with the precursor of the In metal layer and the Cu—Ga alloy layer after the evacuating step. Thus, Se components are effectively extracted as CIGS making up the light absorbing layer.

In the evacuating step, hydrogen selenide gas may be repeatedly replaced according to a required amount of Se components.

According to the present invention, hydrogen selenide gas may be supplied immediately after the first selenization step and immediately before the second selenization step and hydrogen selenide gas may be continuously supplied during the second selenization step in which a temperature has risen to 250° to 450° C. Thus, it is possible to stably keep the ambient environment of the substrate containing Se components, thereby efficiently extracting Se components into the light absorbing layer.

In this case, an amount of hydrogen selenide gas continuously supplied in the second selenization step per unit time is preferably set smaller than an amount of hydrogen selenide gas supplied per unit time immediately after the first selenization step and immediately before the second selenization step. Since the temperature of the second selenization step is set higher than that of the first selenization step, selenium is more easily extracted. Therefore, the amount of supplied hydrogen selenide is reduced to prevent selenium from being extracted too much.

The substrates are raised or placed almost in an upright position in a cabinet rotatably disposed in the airtight space and the cabinet is rotated at least in one of the first, second, third selenization steps and the cooling step. Thus, it is possible to positively obtain the even distribution of the constituent components of a chalcopyrite compound regardless of the position of the substrate placed upright in the cabinet. Since the two or more substrates are accommodated in the cabinet, processing efficiency is improved for the substrates annealed in each rotating operation.

In other words, even when the plurality of substrates are accommodated on different positions, the substrates exposed to hydrogen selenide gas have a constant amount of contact. Therefore, the light absorbing layers with high-quality film structures can be obtained over all the substrates accommodated in the cabinet.

According to the process for producing the light absorbing layer for the chalcopyrite type thin-film solar cell of the present invention, in the first selenization step having a relatively low temperature, the interior of the airtight space is preheated and an atmosphere in the airtight space is stabilized by introducing hydrogen selenide gas. In the second selenization step having a relatively high temperature, Se components are extracted into the light absorbing layer and Ga components are diffused in the light absorbing layer. In the third selenization step having a higher temperature, the film structure is reconstructed by crystallizing CIGS. Thus, in the film structure of the obtained light absorbing layer, the constituent components of a chalcopyrite compound, particularly elements of Ga and Se are evenly distributed.

Therefore, with the solar cell comprising the light absorbing layer produced according to the present invention, it is possible to positively achieve superiority in photoelectric conversion, which is a characteristic of the chalcopyrite type thin-film solar cell.

BEST MODE FOR CARRYING OUT THE INVENTION

As in FIG. 1 described above, a chalcopyrite type thin-film solar cell according to the present invention has a multilayer structure 7 in which an Mo electrode layer 2, a Na dipping layer 3, a CIGS light absorbing layer 4, a buffer layer 5 and a transparent electrode layer 6 are sequentially superimposed on a substrate 1 made of SLG glass or the like. The Na dipping layer 3 may be omitted. In some cases, the buffer layer 5 may be also omitted. When the substrate 1 contains much impurity, a barrier layer may be interposed between the substrate 1 and the electrode layer 2 to prevent the impurity from being diffused from the substrate 1 to the electrode layer 2. The barrier layer is made of a material such as $SiO_2$, TiN and SiN. The thin-film solar cell is produced in response to its layer structure according to the producing process shown in FIG. 2. For example, in the case of a layer structure having no Na dipping layer 3, the Na dipping layer deposition step shown in FIG. 2(c) is omitted.

Figure 3:
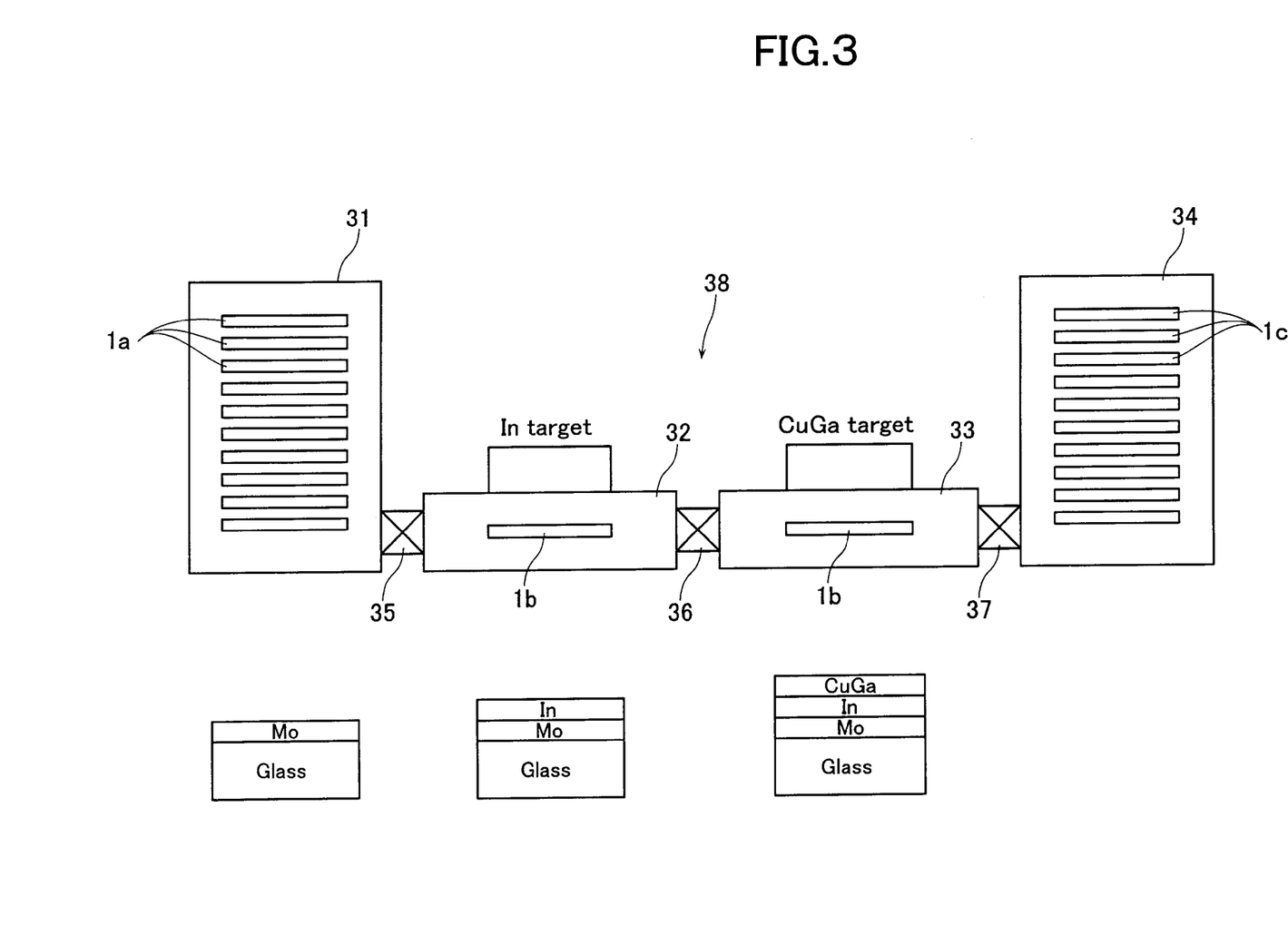
FIG. 3 is a schematic diagram showing an inline sputter deposition device for forming a laminated precursor of an In metal layer and a Cu—Ga alloy layer.

FIG. 3 shows a deposition device for producing the precursor of the light absorbing layer according to the present invention.

FIG. 3 corresponds to the precursor forming step of FIG. 2(d) and is a schematic diagram showing an inline sputtering device 38 in which a supply chamber 31, a first sputter deposition chamber 32, a second sputter deposition chamber 33, and a removal chamber 34 are connected via sluice valves 35, 36 and 37. Evacuating mechanisms (not shown) are respectively connected to the chambers 31, 32, 33 and 34 of the sputtering device 38.

The supply chamber 31 includes a substrate support (not shown) for accommodating a plurality of substrates 1a in batches. Mo electrode layers have been already formed on the substrates 1a accommodated in the loading chamber 31. Of the substrates 1a accommodated in batches, substrates 1b to be deposited are transported one by one to the first deposition chamber 32 through the sluice valve 35 while being held by a substrate holder (not shown) such as a substrate transport tray.

The sluice valves 35 and 36 on both sides of the first deposition chamber 32 are closed. In the first deposition chamber 32, according to sputtering deposition using an In target, a metallic In layer is formed on a surface of the Mo electrode layer on the substrate 1b by using Ar gas or the like with a predetermined pressure. Similarly, in the subsequent second deposition chamber 33, a Cu—Ga layer is formed on a surface of the In layer on the substrate 1b according to sputtering deposition using a Cu—Ga alloy target, so that the precursor forming step is completed. After the forming step, a substrate 1c is transported to the removal chamber 34 through the sluice valve 37. The removal chamber 34 includes a substrate support similar to that of the supply chamber 31. The plurality of substrates 1c are accommodated in batches on the support.

Figure 4:
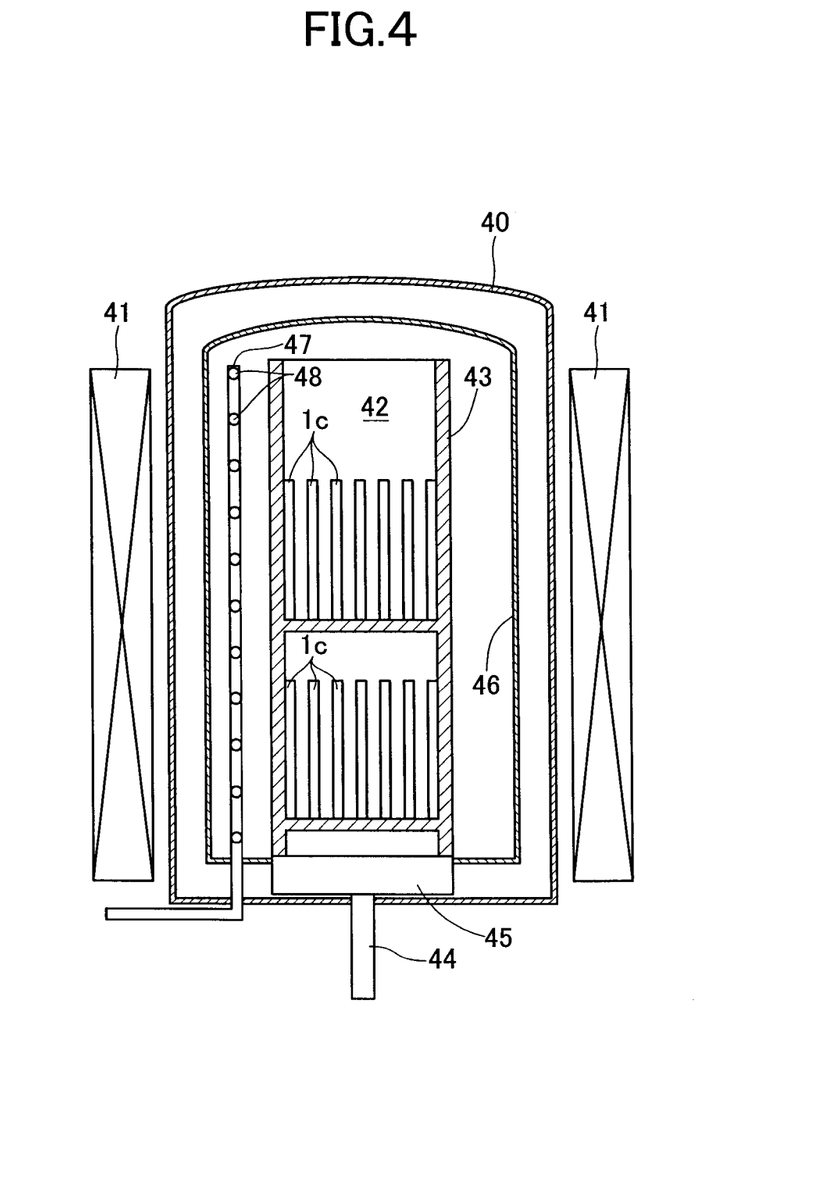
FIG. 4 is a schematic diagram showing a heat treatment chamber for forming a CIGS light absorbing layer.

FIG. 4 is a schematic diagram showing a heat treatment chamber 40 for selenizing the precursor according to the present invention and FIG. 4 corresponds to the selenization of the precursor for the light absorbing layer shown in FIG. 2(e). The heat treatment chamber 40 is heated by heaters 41 disposed on both sides thereof. After the substrates 1c are accommodated in batches into a quartz boat (cabinet) 42 by a transfer robot, the quartz boat 42 having the two or more substrates 1c accommodated upright on its bottom is inserted from the bottom of the heat treatment chamber 40 and is placed into the heat treatment chamber 40. Further, a quartz receptor 43 is provided for keeping the substrates 1c upright on the boat 42. A rotary drive shaft 44 connected to an external driving mechanism is joined via a joint 45 to the quartz boat 42 provided with the receptor 43. While keeping the substrates 1c accommodated upright, the boat 42 can be rotated by driving the rotary shaft 44.

Further, the quartz boat 42 having the substrates 1c is surrounded by a quartz process tube 46. An airtight space surrounded by the process tube 46 can be changed in pressure by an evacuating mechanism (not shown) and a gas inlet tube 47 for introducing hydrogen selenide gas is inserted into the airtight space. A number of nozzle holes 48 are bored on the surrounding wall of the gas inlet tube 47, and hydrogen selenide gas flows into the process tube 46 from the nozzle holes 48. The nozzle hole 48 has a diameter of 1 to 2 mm to evenly pass hydrogen selenide gas through the process tube 46.

EXAMPLES

Figure 5:
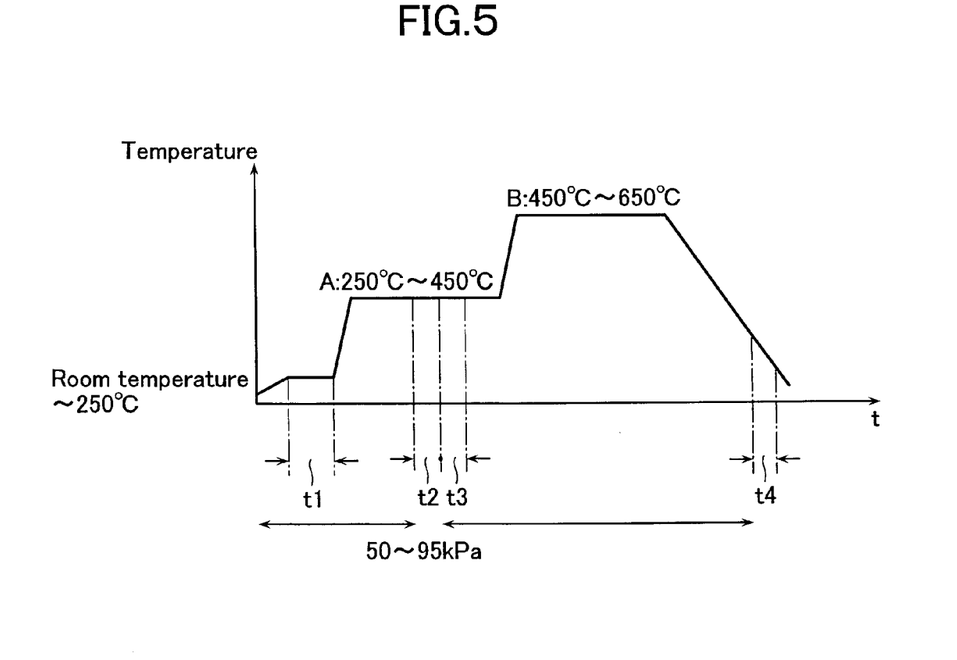
FIG. 5 is a diagram showing a temperature profile used in Example 1.
Figure 6:
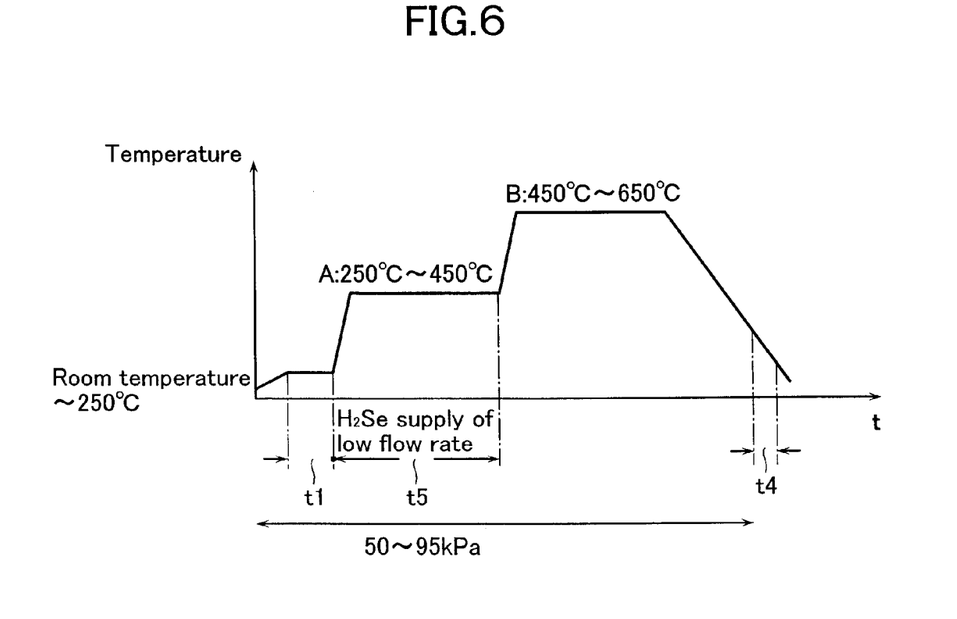
FIG. 6 is a diagram showing a temperature profile used in Example 2.

Referring to FIGS. 4, 5 and 6, the following will specifically discuss the method of producing the light absorbing layer for the thin-film solar cell according to the present invention.

Example 1

When the light absorbing layer 4 (FIG. 1) is produced, the predetermined number of glass substrates 1c are accommodated in the heat treatment chamber 40 shown in FIG. 4. The In metal layer and the Cu—Ga alloy layer have been superimposed on the substrate 1c by using the inline sputter deposition device 38 (FIG. 3). Then, selenization is performed according to a temperature profile shown in FIG. 5.

In other words, the interior of the process tube 46 is heated by the heaters 41 so as to range from room temperature to 250° C., more preferably to range from 30° to 150° C. In a state in which the interior of the process tube 46 is kept at a predetermined temperature within this range, hydrogen selenide ($H_2Se$) gas is introduced from the nozzle holes 48 of the gas inlet tube 47 with a predetermined flow rate for time $t_1$ while keeping the interior of the process tube 46 at a reduced pressure of 50 to 95 kPa in response to the operation of the evacuating mechanism. The above first selenization step is provided to stabilize an atmosphere of $H_2Se$ gas in the heat treatment chamber 40 and preheat the heat treatment chamber 40 to a temperature higher than room temperature. Preferably the time $t_1$ is, for example, about ten minutes.

Further, in the first selenization step, the rotary drive shaft 44 is rotated with a constant speed of 1 to 2 rpm, thereby further stabilizing the ambient environment of the simultaneously rotating substrates 1c, that is, the atmosphere of $H_2Se$ gas at the preheating temperature. By rotating the substrates 1c in second and third selenization steps and a cooling step (described later) as well as the first selenization step, the substrates 1c can be annealed more effectively.

After the first selenization step, an internal temperature A of the process tube 46 is increased by the heaters 41 so as to range from 250° to 450° C., more preferably to range from 300° to 450° C. In a state in which the internal temperature A is kept at a predetermined temperature within the range, $H_2Se$ gas is introduced from the nozzle holes 48 for, for example, 10 to 120 minutes while keeping the interior of the process tube 46 at a reduced pressure of 50 to 95 kPa. The above second selenization step is provided to extract Se components while diffusing components of In, Cu and Ga in the precursor for the light absorbing layer having the layer structure of the In layer and the Cu—Ga layer on the substrate 1c.

At some point of the second selenization step, the supply of $H_2Se$ gas is stopped and the $H_2Se$ gas is discharged through an evacuating step, in which the interior of the process tube 46 is kept in a high vacuum for about time $t_2$ (=1 minute) And then, a predetermined amount of fresh $H_2Se$ gas is introduced again from the nozzle holes 48 for time $t_3$. The interior of the process tube 46 is kept in a high vacuum in the evacuating step for the time $t_2$ immediately before the time $t_3$, so that the $H_2Se$ gas of Se components extracted in the second selenization step becomes more active. Since it is not necessary to consider the influence of residual gas resulting from the first selenization step, the extraction of Se components in the second selenization step can be correctly controlled by introducing the predetermined amount of $H_2Se$ gas. When a relatively large amount of $H_2Se$ gas is introduced in the second selenization step, the $H_2Se$ gas may be dividedly introduced several times to accurately control a flow rate. In this case, it is necessary to keep the interior of the process tube 46 in the high vacuum immediately before each introduction. Therefore, the flow rate of $H_2Se$ gas can be controlled with higher accuracy.

In this example, the evacuation time $t_2$ is set at 1 minute. Components such as In evaporate from the precursor during processing because the interior of the process tube 46 is kept in a vacuum at a high temperature. Thus, the time $t_2$ may be shortened using a high-performance vacuum device.

After the second selenization step, without discharging $H_2Se$ gas remaining in the process tube 46, the internal temperature B of the process tube 46 is increased by the heaters 41 so as to range from 450° to 650° C., more preferably to range from 500° to 650° C. while being kept at a reduced pressure of 50 to 95 kPa. Then, the internal temperature B is kept at a predetermined temperature within this range for 10 to 120 minutes. The third selenization step is provided to stably reconstruct the internal film structure by recrystallizing the precursor for the light absorbing layer. The precursor has been made uniform by diffusing the components of In, Cu and Ga and extracting Se components.

Thereafter, the temperature in the process tube 46 is gradually reduced to room temperature, and then the substrates 1c with light absorbing layers are taken out. Meanwhile, residual $H_2Se$ gas may act on the cooled substrates Ic and Se may unnecessarily precipitate thereon. In order to prevent the precipitation, the interior of the process tube 46 may be evacuated to a high vacuum for time $t_4$ in the cooling step. Further, the quartz boat 42 is desirably rotated by the rotary drive shaft 44 with a constant speed immediately before the substrates 1c are taken out.

Example 2

As in Example 1, the glass substrates 1c on which the In metal layer and the Cu—Ga alloy layer are superimposed are accommodated in the heat treatment chamber 40. Then, selenization is performed according to a temperature profile shown in FIG. 6. The temperature profile of this example is different from that of FIG. 5 in that $H_2Se$ gas is supplied with a relatively low flow rate immediately after the first selenization step and the $H_2Se$ gas is continuously supplied without interruption in the second selenization step after the temperature increases to 250° to 450° C. In FIG. 6, time $t_5$ represents the second selenization step including heating-up time immediately after the first selenization step.

In the second selenization step having longer Se extraction time, the flow rate of continuously supplied $H_2Se$ gas per unit time is set lower than that of the second selenization step of Example 1. In this second selenization step, Se components can be extracted into the light absorbing layer with relative ease by stably keeping the ambient environment of the substrate 1C containing the Se components, thereby improving the extraction efficiency of the Se components. In this case, the generation of CIGS depends upon the total amount and partial pressure of supplied $H_2Se$ gas in the second selenization step. It is thus necessary to match the total amount of supplied $H_2Se$ gas with a predetermined amount.

In Example 2, as in Example 1, a cooling step may include an evacuating step of about time $t_4$ and the quartz boat 42 is desirably rotated by the rotary drive shaft 44 with a constant speed immediately before the substrates 1c are taken out.

INDUSTRIAL APPLICABILITY

The present invention is used for producing a light absorbing layer for a thin-film solar cell made of a chalcopyrite compound (CIGS), and the present invention can be used as a solar cell with high photoelectric conversion efficiency by connecting in series cells of the thin-film solar cell including a light absorbing layer of CIGS.

The invention claimed is:

1. A process for producing a light absorbing layer for a chalcopyrite type thin-film solar cell, comprising the steps of:
   a precursor forming step of superimposing on a backside electrode layer formed on a substrate, an In metal layer adjacent to the electrode layer and a Cu—Ga alloy layer by sputtering;
   a first selenization step of accommodating the precursor-formed substrate in an airtight space and introducing hydrogen selenide gas into the airtight space conditioned to a temperature in a range from room temperature to 250° C.;
   a second selenization step of heating an interior of the airtight space to a temperature in a range from 250° to 450° C., additionally introducing hydrogen selenide gas into the airtight space, interrupting the supply of hydrogen selenide gas and evacuating the interior of the airtight space followed by reintroducing hydrogen selenide gas into the airtight space for 10 minutes to 120 minutes to introduce selenium into the precursor and diffuses In, Cu, and Ga in the precursor;
   a third selenization step of heating an interior of the airtight space to a temperature in a range from 450° to 650° C., and performing heat treatment of the substrate under the above temperature conditions using the hydrogen selenide gas reintroduced at the second selenization step for 10 minutes to 120 minutes to recrystallize the precursor to form the light absorbing layer; and a cooling step of cooling the substrate after the heat treatment.

2. The process for producing the light absorbing layer for the chalcopyrite type thin-film solar cell according to claim 1, wherein the substrate is accommodated in an upright position in a cabinet rotatably disposed in the airtight space and the cabinet is rotated in at least one of the first, second, third selenization steps and the cooling step.

* * * * *